(12) United States Patent
    Liu

(10) Patent No.: US 10,398,054 B1
(45) Date of Patent: Aug. 27, 2019

(54) SERVER

(71) Applicants: Inventec (Pudong) Technology Corporation, Shanghai (CN); INVENTEC CORPORATION, Taipei (TW)

(72) Inventor: Chao-Chih Liu, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/215,670

(22) Filed: Dec. 11, 2018

(30) Foreign Application Priority Data

Nov. 21, 2018 (CN) .............................. 2018 1 138795

(51) Int. Cl.
    *G06F 1/18* (2006.01)
    *H05K 7/14* (2006.01)

(52) U.S. Cl.
    CPC ........... *H05K 7/1489* (2013.01); *G06F 1/187* (2013.01); *H05K 7/1401* (2013.01)

(58) Field of Classification Search
    CPC ..................................................... G06F 1/187
    See application file for complete search history.

(56) References Cited

U.S. PATENT DOCUMENTS

| | | | | |
|---|---|---|---|---|
| 4,833,554 A | * | 5/1989 | Dalziel .................. | G06F 1/184 360/69 |
| 5,683,159 A | * | 11/1997 | Johnson .................. | G06F 1/184 312/223.2 |
| 6,069,789 A | * | 5/2000 | Jung ....................... | G06F 1/184 361/679.32 |
| 6,172,877 B1 | * | 1/2001 | Feye-Hohmann ...... | G06F 1/184 361/728 |
| 9,703,333 B1 | * | 7/2017 | Harting .................. | G06F 1/187 |
| 2003/0223201 A1 | * | 12/2003 | Son ......................... | G06F 1/184 361/752 |
| 2007/0035920 A1 | * | 2/2007 | Peng ....................... | G06F 1/187 361/679.31 |
| 2015/0015131 A1 | * | 1/2015 | Privitera ................. | G06F 1/183 312/309 |

* cited by examiner

*Primary Examiner* — Adrian S Wilson
(74) *Attorney, Agent, or Firm* — CKC & Partners Co., LLC

(57) ABSTRACT

A server includes a casing, a plurality of tensile elements and a plurality of modules. The casing has an opening and a chamber communicating with each other. The tensile elements are disposed on the casing and at least partially cover the opening. Each of modules is configured to abut against the corresponding tensile element, such that the corresponding tensile element at least partially extends elastically towards the chamber. The modules penetrate through the opening and enter into the chamber in order to fix the modules to the casing.

9 Claims, 4 Drawing Sheets

US 10,398,054 B1

SERVER

CROSS-REFERENCE TO RELATED APPLICATION

This application claims priority to China Application Serial Number 201811387951.3, filed Nov. 21, 2018, the disclosures of which are incorporated herein by reference in their entireties.

BACKGROUND

Description of Related Art

With the advancement of technology, internet has become one of the major information exchange media in the modern life. In order to provide diversified network services, server is indispensable equipment. The host computer can access the data in the servers through the network, in order to achieve a rapid information transmission.

On the practical operation of the server, allowing the user to install or uninstall the modules in a simple and easy manner can be undoubtedly convenient to the user.

SUMMARY

A technical aspect of the present disclosure is to provide a server, which can take out the module from the casing in a simple and easy manner.

According to an embodiment of the present disclosure, a server includes a casing, a plurality of tensile elements and a plurality of modules. The casing has an opening and a chamber communicating with each other. The tensile elements are disposed on the casing and at least partially cover the opening. Each of modules is configured to abut against the corresponding tensile element, such that the corresponding tensile element at least partially extends elastically towards the chamber. The modules penetrate through the opening and enter into the chamber in order to fix the modules to the casing.

In one or more embodiments of the present disclosure, each of the modules has a first end and a second end opposite to each other. The first end is configured to abut against the corresponding tensile element. Each of the modules further has a first buckling portion disposed on the corresponding second end. The casing further has a plurality of second buckling portions. The first buckling portions are configured to buckle with the second buckling portions.

In one or more embodiments of the present disclosure, each of the tensile elements has a first positioning portion. Each of the modules further has a second positioning portion located on the corresponding first end. Each of the first positioning portions is configured to mutually fix with the corresponding second positioning portion.

In one or more embodiments of the present disclosure, each of the first positioning portions is a through hole. Each of the second positioning portions is a connecting port configured to be fixed in the corresponding through hole.

In one or more embodiments of the present disclosure, the server further includes two shafts disposed on two opposite outer sides of the casing. The opening locates between the shafts. Each of the tensile elements is a flat strip. Two opposite ends of each of the tensile elements respectively wind about the shafts.

In one or more embodiments of the present disclosure, each of the shafts has a plurality of protruding portions distributed along an extension direction of the corresponding shaft. Each of the tensile elements is restricted between two of the protruding portions.

In one or more embodiments of the present disclosure, the server further includes two covers detachably disposed on two opposite outer sides of the casing. The opening locates between the covers. Each of the shafts and the end of the tensile element winding about the corresponding shaft are respectively located in the corresponding cover.

In one or more embodiments of the present disclosure, the casing further has a plurality of guiding pieces disposed on an inner wall of the casing. When one of the tensile elements extends elastically into the chamber, the corresponding tensile element is at least partially restricted between two of the guiding pieces.

In one or more embodiments of the present disclosure, each of the tensile elements is formed by a connection of two constant force springs.

When compared with the prior art, the above-mentioned embodiments of the present disclosure have at least the following advantages:

(1) When the buckle between the first buckling portion of the module and the second buckling portion of the casing is released, the tensile element then releases the potential energy stored and recovers the winding about the shafts. Consequently, the module is pushed out of the casing. In this way, the user can take out the module from the casing in a simple and easy manner.

(2) Since the taking out of the module from the casing in the simple and easy manner does not involve the use of additional tools, it is convenient to the user.

(3) Since the tensile element can be formed by a connection of two constant force springs, the manufacturing cost of the server can be effectively reduced because the guiding components mounted on the outside of the module in the past are eliminated.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
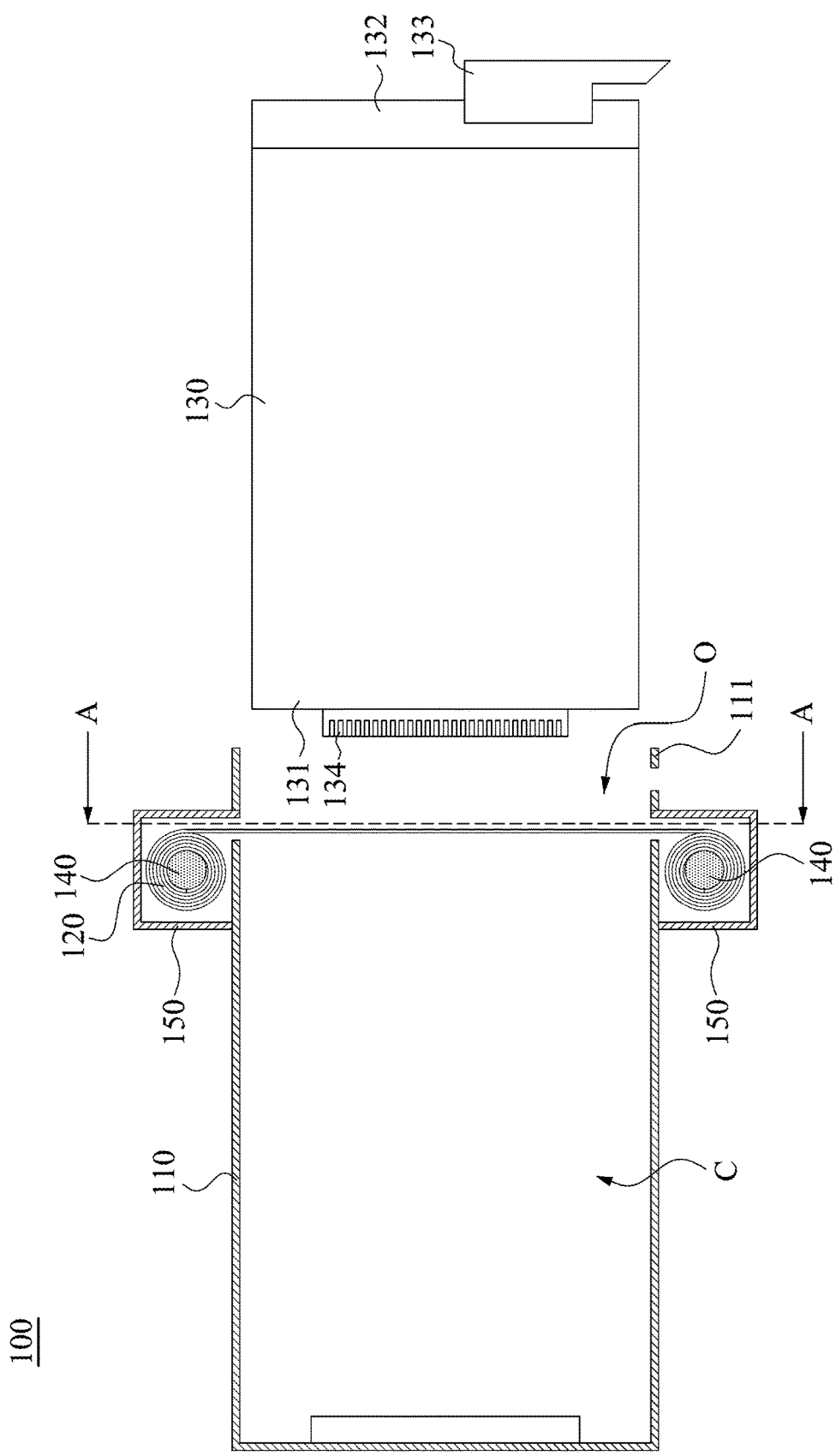
FIG. 1 is a sectional side view of a server according to an embodiment of the present disclosure, in which the module is outside the casing.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is made to FIG. 1. FIG. 1 is a sectional side view of a server 100 according to an embodiment of the present disclosure, in which the module 130 is outside the casing 110. In this embodiment, as shown in FIG. 1, a server 100 includes a casing 110, a plurality of tensile elements 120 and a plurality of modules 130. The casing 110 has an opening O and a chamber C communicating with each other. The tensile elements 120 are disposed on the casing 110. The tensile elements 120 at least partially cover the opening O. Each of modules 130 is configured to abut against the corresponding tensile element 120, and the modules 130 are configured to penetrate through the opening O and enter into the chamber C, in order to fix the modules 130 to the casing 110. In practical applications, the modules 130 can be Enterprise and Datacenter Storage Form Factors (EDSFF), or memory modules of different sizes such as mechanical hard disks with different reading and writing heads. However, this does not intend to limit the present disclosure.

Figure 2:
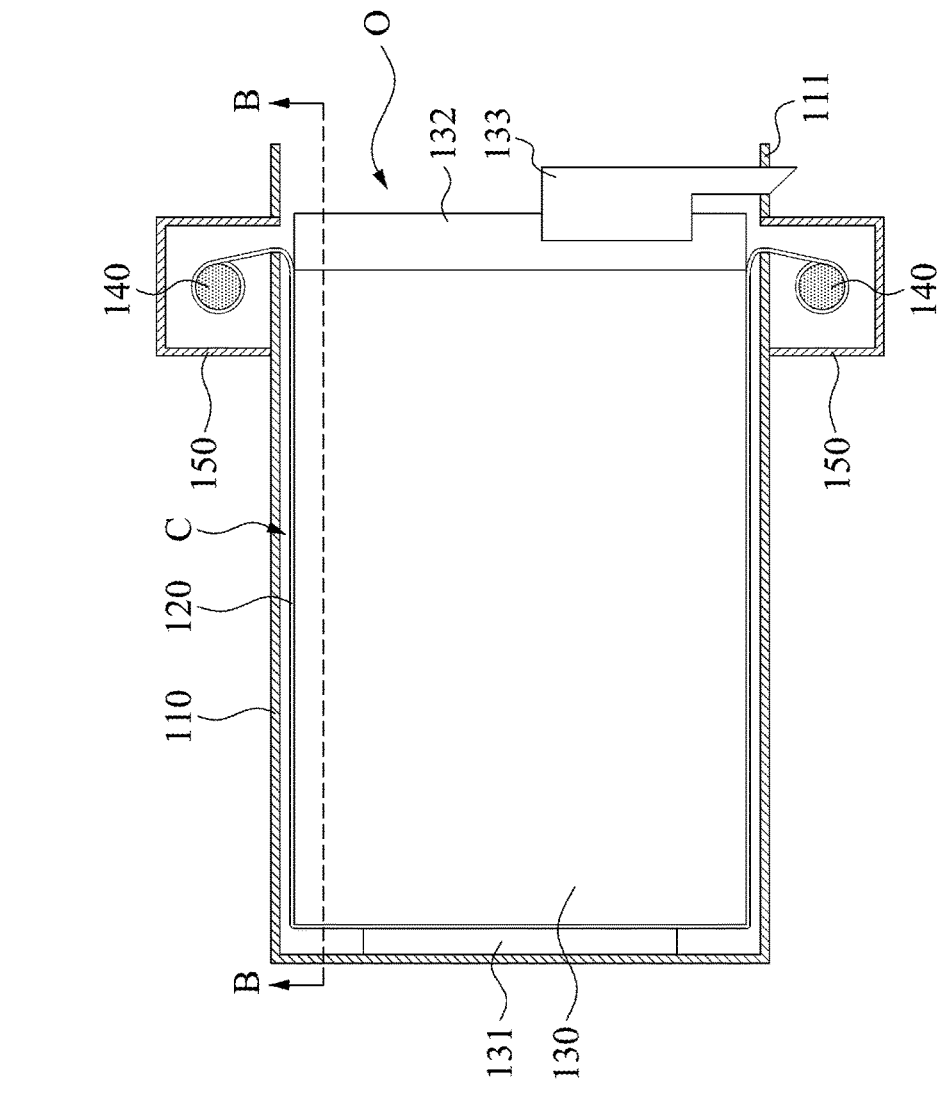
FIG. 2 is a sectional side view of the server of FIG. 1, in which the module is installed inside the casing.

Please refer to FIG. 2. FIG. 2 is a sectional side view of the server 100 of FIG. 1, in which the module 130 is installed inside the casing 110. In this embodiment, as shown in FIG. 2, when the module 130 penetrates through the opening O and enters into the chamber C and to be fixed in the casing 110, the tensile element 120 is compressed by the module 130, such that the tensile element 120 at least partially extends elastically towards the chamber C.

As shown in FIGS. 1-2, the module 130 has a first end 131 and a second end 132 opposite to each other. The first end 131 is configured to abut against the tensile element 120. The module 130 further has a first buckling portion 133. The first buckling portion 133 is disposed on the second end 132. On the contrary, the casing 110 has a second buckling portion 111. The first buckling portion 133 is configured to buckle with the second buckling portion 111. When the module 130 penetrates through the opening O and enters into the chamber C, though the mutual buckling between the first buckling portion 133 and the second buckling portion 111, the module 130 can be fixed in the casing 110.

Figure 3:
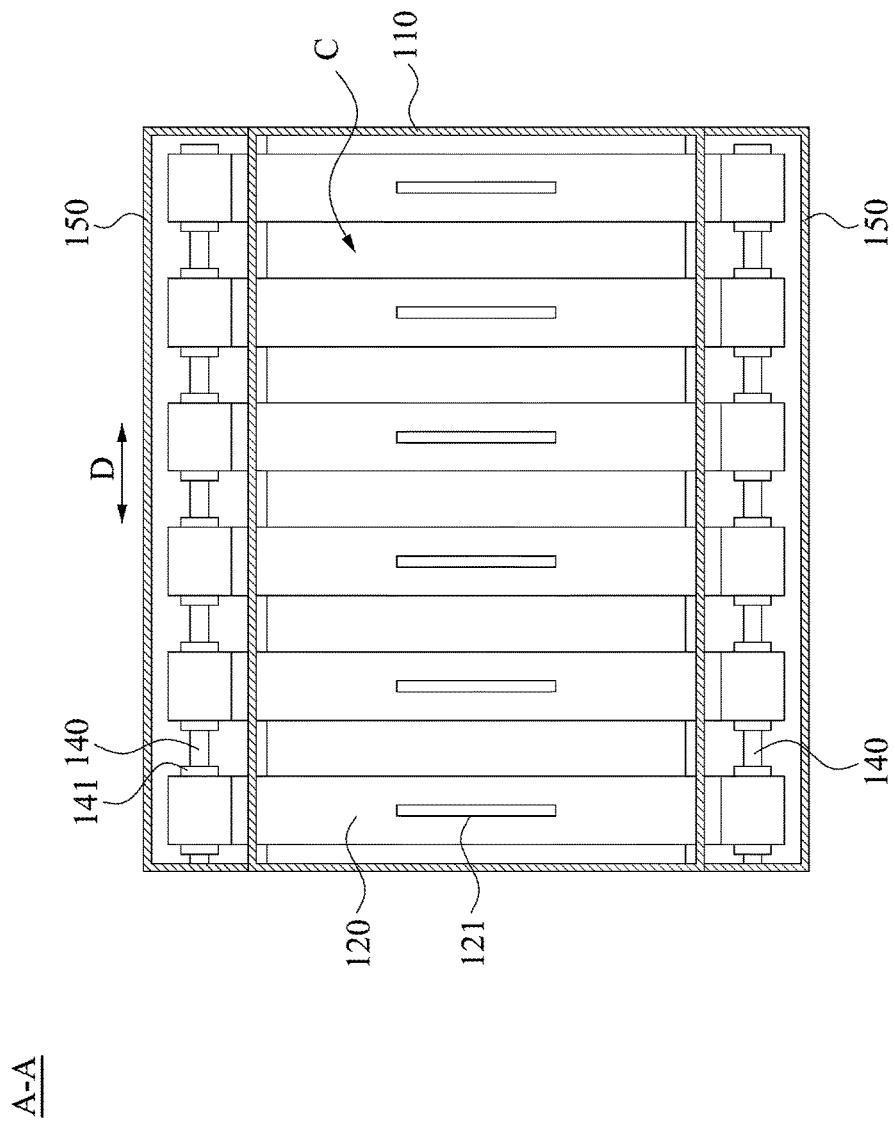
FIG. 3 is a sectional view along the section line A-A in FIG. 1.

Reference is made to FIG. 3. FIG. 3 is a sectional view along the section line A-A in FIG. 1. As shown in FIG. 3, the quantity of the tensile element 120 is plural, and the quantity of the module 130 is also plural (the plurality of the modules 130 is not shown, but it can be understood that each of the tensile elements 120 can be corresponding to one of the modules 130). In addition, as shown in FIG. 1 and FIG. 3, the tensile element 120 has a first positioning portion 121. The module 130 has a second positioning portion 134. The second positioning portion 134 is located on the first end 131. To be more specific, the first positioning portion 121 of the tensile element 120 is configured to mutually fix with the second positioning portion 134 of the module 130, so as to fix the relative position between the module 130 and the tensile element 120.

In the practical applications, the first positioning portion 121 of the tensile element 120 is a through hole, while the second positioning portion 134 of the module 130 is a connecting port. The connecting port is configured to be fixed in the through hole. To be more specific, when the first end 131 of the module 130 abuts against the tensile element 120, the connecting port of the module 130 inserts into the through hole of the tensile element 120, and to be fixed in the through hole of the tensile element 120, such that the connecting port and the through hole are fixed to each other.

In addition, as shown in FIGS. 1-3, the server 100 further includes two shafts 140. The shafts 140 are disposed on two opposite outer sides of the casing 110. The opening O of the casing 110 is located between the shafts 140. In this embodiment, the tensile element 120 is a flat strip, and two opposite ends of the tensile element 120 respectively wind about the shafts 140.

When the first end 131 of the module 130 abuts against the tensile element 120, as mentioned above, the first positioning portion 121 of the tensile element 120 and the second positioning portion 134 of the module 130 fix with each other. In addition, when the module 130 penetrates through the opening O and enter into the chamber C, the tensile element 120 at least partially extends elastically towards the chamber C. To be more specific, when the module 130 gradually enters into the chamber C, the tensile element 120 also gradually releases the winding about the shafts 140 and rolls out from the shafts 140. In this way, the tensile element 120 is pulled to generate a tension, and tends to recover the winding about the shafts 140 and push the module 130 out of the casing 110. When the first buckling portion 133 of the module 130 mutually buckles with the second buckling portion 111 of the casing 110, to make the module 130 be fixed in the casing 110, the tensile element 120 remains in the status of elastic extension and stores some potential energy.

When the buckling between the first buckling portion 133 of the module 130 and the second buckling portion 111 of the casing 110 is released, the tensile element 120 then releases the potential energy stored and recovers the winding about the shafts 140. Consequently, the module 130 is pushed out of the casing 110. In this way, the user can take out the module 130 from the casing 110 in a simple and easy manner.

In other embodiments, according to the actual situation, the tensile element 120 can be formed by a connection of two constant force springs. In this way, the manufacturing cost of the server 100 can be effectively reduced because the guiding components mounted on the outside of the module 130 in the past are eliminated.

Furthermore, since the taking out of the module 130 from the casing 110 in the simple and easy manner does not involve the use of additional tools, it is convenient to the user.

On the other hand, as shown in FIG. 3, each of the shafts 140 has a plurality of protruding portions 141. The protruding portions 141 of the shaft 140 are distributed along an extension direction D of the shaft 140. Each of the tensile elements 120 is restricted between two of the protruding portions 141. In this way, the tensile element 120 can be fixed relative to the shaft 140, and does not move relative to the shaft 140 along the extension direction D. In practical applications, the protruding portions 141 can be circlips. However, this does not intend to limit the present disclosure.

Moreover, as shown in FIGS. 1-3, the server 100 further includes two covers 150. The covers 150 are detachably disposed on two opposite outer sides of the casing 110. The opening O of the casing 110 is located between the covers 150, in which each of the shafts 140 and the end of the tensile element 120 winding about the corresponding shaft 140 are at least partially located in the corresponding cover 150. To be specific, the cover 150 can be detachably disposed outside the casing 110 by ways of screwing or buckling. However, this does not intend to limit the present disclosure.

Figure 4:
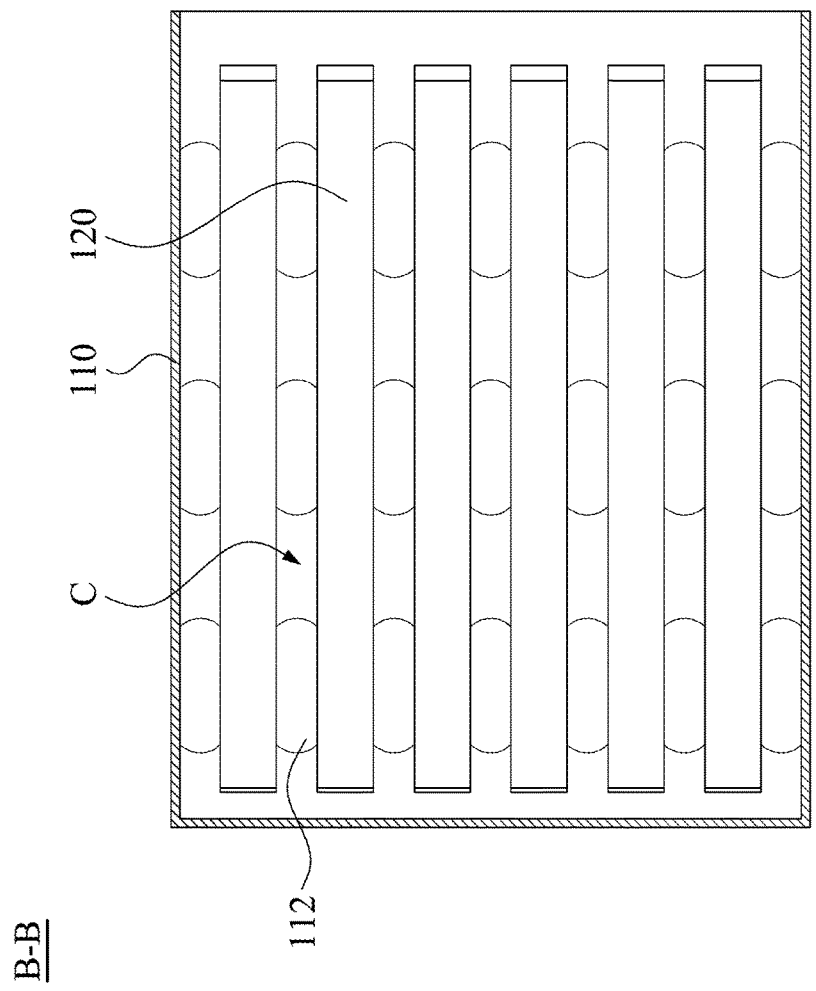
FIG. 4 is a sectional view along the section line B-B in FIG. 2.

Reference is made to FIG. 4. FIG. 4 is a sectional view along the section line B-B in FIG. 2. In this embodiment, as shown in FIG. 4, the casing 110 further has a plurality of guiding pieces 112. The guiding pieces 112 are disposed on an inner wall of the casing 110. When one of the tensile elements 120 extends elastically into the chamber C of the casing 110, the tensile element 120 is at least partially restricted between two of the guiding pieces 112. In this way, the route along which the module 130 penetrates through the opening O and enters into the chamber C is also guided by the guiding pieces 112. Preferably, a width of the tensile element 120 is large than a thickness of the module 130, so as to cover the outer edge of the module 130. In this way, when the module 130 moves relative to the casing 110, the module 130 is avoided from being scratched.

In conclusion, when compared with the prior art, the aforementioned embodiments of the present disclosure have at least the following advantages:

(1) When the buckle between the first buckling portion of the module and the second buckling portion of the casing is released, the tensile element then releases the potential energy stored and recovers the winding about the shafts. Consequently, the module is pushed out of the casing. In this way, the user can take out the module from the casing in a simple and easy manner.

(2) Since the taking out of the module from the casing in the simple and easy manner does not involve the use of additional tools, it is convenient to the user.

(3) Since the tensile element can be formed by a connection of two constant force springs, the manufacturing cost of the server can be effectively reduced because the guiding components mounted on the outside of the module in the past are eliminated.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A server, comprising:
    a casing having an opening and a chamber communicating with each other;
    a plurality of tensile elements disposed on the casing and at least partially covering the opening; and
    a plurality of modules, each of the modules being configured to abut against the corresponding tensile element, such that the corresponding tensile element at least partially extends elastically towards the chamber, the modules penetrate through the opening and enter into the chamber in order to fix the modules to the casing.

2. The server of claim 1, wherein each of the modules has a first end and a second end opposite to each other, the first end is configured to abut against the corresponding tensile element, each of the modules further has a first buckling portion disposed on the corresponding second end, the casing further has a plurality of second buckling portions, the first buckling portions are configured to buckle with the second buckling portions.

3. The server of claim 2, wherein each of the tensile elements has a first positioning portion, each of the modules further has a second positioning portion located on the corresponding first end, each of the first positioning portions is configured to mutually fix with the corresponding second positioning portion.

4. The server of claim 3, wherein each of the first positioning portions is a through hole, each of the second positioning portions is a connecting port configured to be fixed in the corresponding through hole.

5. The server of claim 1, further comprising two shafts disposed on two opposite outer sides of the casing, the opening locating between the shafts, wherein each of the tensile elements is a flat strip, two opposite ends of each of the tensile elements respectively wind about the shafts.

6. The server of claim 5, wherein each of the shafts has a plurality of protruding portions distributed along an extension direction of the corresponding shaft, each of the tensile elements is restricted between two of the protruding portions.

7. The server of claim 5, further comprising two covers detachably disposed on two opposite outer sides of the casing, the opening locating between the covers, wherein each of the shafts and the end of the tensile element winding about the corresponding shaft are respectively located in the corresponding cover.

8. The server of claim 1, wherein the casing further has a plurality of guiding pieces disposed on an inner wall of the casing, when one of the tensile elements extends elastically into the chamber, the corresponding tensile element is at least partially restricted between two of the guiding pieces.

9. The server of claim 1, wherein each of the tensile elements is formed by a connection of two constant force springs.

\* \* \* \* \*